US012763114B2

(12) United States Patent
Chen et al.

(10) Patent No.: US 12,763,114 B2
(45) Date of Patent: Oct. 13, 2026

(54) CIRCUIT WITH A LOW-POWER CHARGE-SHARING LIGHT-SLEEP MODE

(71) Applicant: QUALCOMM Incorporated, San Diego, CA (US)

(72) Inventors: Chi-Jui Chen, San Diego, CA (US); Xiao Chen, San Diego, CA (US); Sonia Ghosh, San Diego, CA (US); Hochul Lee, Los Angeles, CA (US); Anil Chowdary Kota, San Diego, CA (US); Giby Samson, San Diego, CA (US)

(73) Assignee: QUALCOMM Incorproated, San Diego, CA (US)

( * ) Notice: Subject to any disclaimer, the term of this patent is extended or adjusted under 35 U.S.C. 154(b) by 402 days.

(21) Appl. No.: 18/340,807

(22) Filed: Jun. 23, 2023

(65) Prior Publication Data

US 2024/0428831 A1 Dec. 26, 2024

(51) Int. Cl.
*G11C 5/14* (2006.01)
*G11C 11/417* (2006.01)

(52) U.S. Cl.
CPC .............. *G11C 5/148* (2013.01); *G11C 5/147* (2013.01); *G11C 11/417* (2013.01); *G11C 2207/2227* (2013.01)

(58) Field of Classification Search
CPC .................. G11C 5/148; G11C 11/417; G11C 2207/2227; G11C 5/147
See application file for complete search history.

(56) References Cited

U.S. PATENT DOCUMENTS 9,183,896 B1 * 11/2015 Adams ................... G11C 5/148
2009/0129192 A1 * 5/2009 Barth, Jr. ................. G11C 8/12 365/230.06
2012/0013319 A1 * 1/2012 Patil ....................... G11C 5/148 323/282
2014/0036612 A1 * 2/2014 Rai ....................... G11C 11/417 365/227
2020/0381042 A1 12/2020 Pilo

OTHER PUBLICATIONS

International Search Report and Written Opinion—PCT/US2024/028666—ISA/EPO—Aug. 5, 2024.
Jain P., et al., "Sleep Circuit for SRAM Core with Improved Noise-Margin", 2008 IEEE International Conference on Integrated Circuit Design and Technology and Tutorial, Jun. 2-4, 2008, 4 Pages.

* cited by examiner

*Primary Examiner* — Alexander Sofocleous
*Assistant Examiner* — Joseph Fidelis Stormes
(74) *Attorney, Agent, or Firm* — Loza & Loza, LLP

(57) ABSTRACT

A circuit is provided with a selectively diode-connected head switch transistor. During a light-sleep mode, the head switch transistor is diode connected so that a power supply voltage passing through the diode-connected head switch transistor is reduced by a transistor threshold voltage drop. During an active mode, the diode connection is opened so that the head switch transistor passes a power supply voltage with virtually no voltage drop.

14 Claims, 5 Drawing Sheets

CIRCUIT WITH A LOW-POWER CHARGE-SHARING LIGHT-SLEEP MODE

TECHNICAL FIELD

This application relates to integrated circuits, and more particularly to an integrated circuit with a low-power charge-sharing light-sleep mode.

BACKGROUND

An integrated circuit embedded memory will typically have various operating modes in which a memory power supply voltage for the embedded memory is varied according to the operating mode. In a default mode (which may also be denoted as a normal mode), the memory power supply voltage is sufficiently elevated for increased memory speed. In contrast, the memory power supply voltage is decreased for a light-sleep mode or even discharged to ground during a deep-sleep mode. For example, during the deep-sleep mode, head switch transistors that intervene between a memory power supply voltage rail and the memory are switched off so that the memory is powered down. In the light-sleep mode, the head switch transistors may also be switched off so that the memory may be powered through diode-connected transistors that couple between the memory power supply voltage rail and the memory. The diode-connected transistors lower the memory power supply voltage by a threshold voltage drop. In this fashion, leakage currents are reduced during the light-sleep mode due to the reduced memory power supply voltage yet the memory may retain its binary contents and also revert back to the active mode relatively quickly.

SUMMARY

In accordance with an aspect of the disclosure, a memory is provided that includes: a bitcell array having a first power supply node for receiving a memory power supply voltage; a voltage rail for a memory power supply voltage; an at least one first transistor having a source coupled to the voltage rail and a drain coupled to the first power supply node; and a second transistor having a source coupled to a gate of the at least one first transistor and having a drain coupled to the first power supply node.

In accordance with another aspect of the disclosure, a method of powering a circuit is provided that includes: switching on a diode-connecting transistor that couples between a gate and a drain of an at least one head switch transistor to diode connect the at least one head switch transistor during a light-sleep mode for the circuit; powering the circuit through the at least one head switch transistor while the diode-connecting transistor is switched on during the light-sleep mode for the circuit; switching off the diode-connecting transistor to return the at least one head switch transistor to a non-diode-connected state during an active mode for the circuit; and powering the circuit through the at least one head switch transistor while the diode-connecting transistor is switched off during the active mode for the circuit.

In accordance with yet another aspect of the disclosure, an integrated circuit is provided that includes: a voltage rail for a power supply voltage; a circuit having a power supply node; and an at least one head switch transistor coupled between the voltage rail and the power supply node, wherein the at least one head switch transistor is configured into a diode-connected state during a light-sleep mode for the circuit and is configured into a non-diode-connected state during an active mode for the circuit.

These and other advantageous features may be better appreciated through the following detailed description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

A memory typically has several operating modes that correspond to different power supply voltage levels. In a default mode of operation, the memory power supply voltage is relatively elevated so that the memory speed is enhanced. Conversely, the memory power supply voltage is discharged in a deep-sleep mode. But in a light-sleep mode, the memory power supply voltage lies between these two extremes. In the light-sleep mode, the memory power supply voltage is sufficient for data retention but is reduced as compared to the default level. In particular, a light-sleep mode as defined herein exists when the bitcells are powered through a diode connection to a voltage rail for a power supply voltage. As compared to the power supply voltage on the voltage rail, the resulting memory power supply voltage for the bitcells during the light-sleep mode is reduced by a transistor threshold voltage drop due to the diode coupling of the bitcells to the voltage rail. During the default mode, the diode coupling is disabled such that the memory power supply voltage substantially equals the power supply voltage on the voltage rail.

To advantageously switch between the default and light sleep modes, a selectively diode-connected head switch transistor(s) is disclosed to provide a light-sleep mode of operation. During the normal mode of operation, the diode connection of the head switch transistors is open circuited. The head switch transistors conduct normally during the active mode such that they pass a memory power supply voltage to the memory with essentially no voltage drop. But the diode connection is closed during the light-sleep mode, which causes the head switch transistors to introduce a transistor threshold voltage drop in the memory power supply voltage as it passes through the head switch transistors to the memory. In a deep-sleep mode, the head switch transistors may be switched off so that the memory is powered down.

Figure 1:
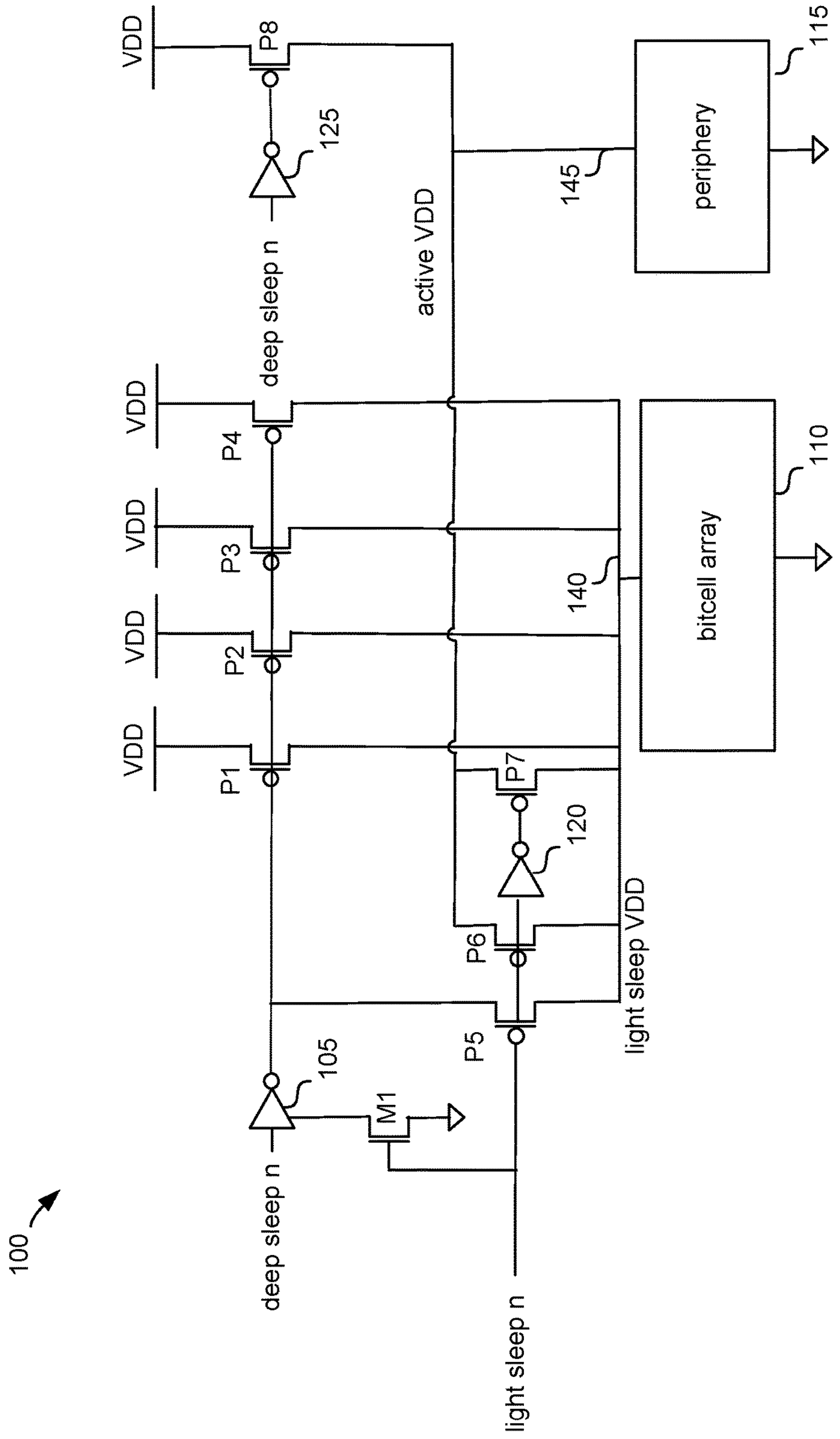
FIG. 1 illustrates a memory powered through selectively diode-connected head switch transistors in accordance with an aspect of the disclosure.

An example memory 100 with an advantageous light-sleep mode is shown in FIG. 1. Memory 100 is a static random-access memory (SRAM) although it will be appreciated that other types of memories may also benefit from the selective diode connection disclosed herein. Memory 100 includes an SRAM bitcell array 110 and a memory periphery 115. Memory periphery 115 includes memory elements such as row and column decoders, sense amplifiers, write drivers, column multiplexers, etc. to form the read and write paths to bitcell array 110. During an active mode, a first power supply node 140 for bitcell array 110 receives a bitcell array power supply voltage as conducted through a plurality of p-type metal-oxide semiconductor (PMOS) head switch transistors P1, P2, P3, and P4.

A source of each of the head switch transistors P1, P2, P3, and P4 couples to a voltage rail for a memory power supply voltage (VDD) whereas a drain of each of these head switch transistors couples to the power supply node 140. During the active mode, the head switch transistors are not diode connected and are fully on. The bitcell array power supply voltage that powers the bitcell array 110 during the active mode is thus virtually equal to the memory power supply voltage because the parallel arrangement of the fully switched-on head switch transistors P1 through P4 introduce relatively little voltage loss. However, it will be appreciated that just one head switch transistor may be used to power bitcell array 110 in alternative implementations. Head switch transistors P1 through P4 are each an example of an at least one first transistor having a source coupled to the voltage rail and a drain coupled to the first power supply node 140. The bitcell array power supply voltage may also be denoted as a virtual power supply voltage VDD (virtual VDD) during the active mode since the bitcell array power supply voltage is virtually equal to the memory power supply voltage VDD during the active mode.

During a deep-sleep mode, the head switch transistors P1 through P4 are off. To switch these transistors off during the deep-sleep mode, an active-low deep-sleep mode signal (deep sleep n) is asserted. Since the deep-sleep mode signal is active low, the deep-sleep mode signal is asserted (having a binary true state) by being discharged to ground. An inverter 105 inverts the deep-sleep mode signal to drive a gate of each of the head switch transistors P1 through P4. An output signal of the inverter is thus charged to the memory power supply voltage during the deep-sleep mode to fully switch off the head switch transistors P1 through P4. The bitcell array 110 is then powered down during the deep-sleep mode and the bitcell array power supply voltage discharged to ground.

A PMOS transistor P5 couples between the gates of the head switch transistors P1 through P4 and the first power supply node 130 to accommodate the selective diode connection of these head switch transistors. Transistor P5 may thus also be denoted as a diode-connecting transistor. An active low light-sleep mode signal (light sleep n) on a first node drives the gate of transistor P5. Thus, when the light-sleep mode signal is asserted by being discharged to begin the light-sleep mode, the head switch transistors P1 through P4 are diode connected. Each of the head switch transistors P1 through P4 then introduces a transistor threshold voltage drop between the memory power supply voltage VDD and the bitcell array power supply voltage at the first power supply node 140. During the light-sleep mode, the bitcell array power supply voltage may thus also be denoted as a light-sleep virtual power supply voltage (light sleep VDD). This reduction in the bitcell array power supply voltage reduces leakage current losses in the bitcell array 110 during the light-sleep mode. But note that the head switch transistors P1 through P4 were not switched off during the light-sleep mode. In contrast, suppose that the head switch transistors P1 through P4 were switched off during the light-sleep mode and the bitcell array 140 powered through separate diode-connected transistors (not illustrated). As compared to the use of such separate diode-connected transistors, the selective diode connection of the head switch transistors P1 through P4 saves an appreciable amount of switching power that would otherwise be consumed with the switching off and on of the head switch transistors in the transitions between the active and light-sleep modes. Transistor P5 is an example of a second transistor having a source coupled to a gate of the at least one first transistor (head switch transistors P1 through P4) and having a drain coupled to the first power supply node 140.

During the light-sleep mode, the deep-sleep mode signal is de-asserted by being charged to the memory power supply voltage. To prevent inverter 105 from discharging the gates of the head switch transistors P1 through P4 during the light-sleep mode, the light-sleep mode signal drives a gate of an n-type metal-oxide semiconductor (NMOS) transistor M1 that couples between a ground node of the inverter 105 and ground. With the light-sleep mode signal asserted by being discharged to ground, transistor M1 is switched off to prevent inverter 105 from grounding the gates of the head switch transistors P1 through P4 during the light-sleep mode. Inverter 105 may also be denoted herein as a second inverter. Transistor M1 is an example of a sixth transistor having a first terminal coupled to a ground terminal of the second inverter (105), a second terminal coupled to ground, and a gate coupled to the first node for the light-sleep mode signal.

The SRAM periphery 115 receives a memory periphery power supply voltage through a second power supply node 145 that couples to a drain of a PMOS head switch transistor P8. Transistor P8 may also be denoted herein as a third transistor. A source of the head switch transistor P8 couples to the memory power supply voltage rail. An inverter 125 inverts the deep-sleep mode signal to control the gate of the head switch transistor P8. The inverter 125 may also be denoted herein as a third inverter. During the deep-sleep mode, the head switch transistor P8 switches off due to the inversion of the deep-sleep mode signal to cause the memory periphery 115 to power down. During the active mode (and also the light-sleep mode), the head switch transistor P8 is fully on such that the memory periphery power supply voltage is virtually equal to the memory power supply voltage VDD. The memory periphery power supply voltage may thus also be denoted as a virtual VDD or active VDD during the active and light-sleep modes. Note that in this implementation of memory 100, the memory periphery 115 does not practice the light-sleep mode. However, in alternative implementations, head switch transistor P8 may be selectively diode connected analogously as discussed for the head switch transistors P1 through P4 such that the memory periphery 115 may also have a light-sleep mode. In other alternative implementations, the head switch transistor P8 may be replaced by a plurality of head switch transistors arranged in parallel as discussed for head switch transistors P1 through P4.

The transistor threshold voltage drop in the bitcell array power supply voltage introduced by the switching on of transistor P5 may cause a delay in the transition from the light-sleep mode to the active mode. In that regard, the first power supply node 140 may have an appreciable amount of capacitance, which affects the voltage charging time. With the bitcell array power supply voltage being lower than the memory power supply voltage by a full transistor threshold voltage drop, there may be too much delay required to transition the bitcell array 110 from the light-sleep mode to the active mode. To slightly increase the bitcell array power supply voltage above a transistor threshold voltage drop from the memory power supply voltage during the light-sleep mode so as to reduce the transition time, a PMOS transistor P6 may have its source coupled to the first power supply node 140 and a drain coupled to the second power supply node 145. The light-sleep mode signal drives a gate of transistor P6 such that transistor P6 is on during the light-sleep mode and is off during the active and deep-sleep modes. Transistor P6 is relatively small compared to the head switch transistors. Recall that the second power supply node 145 is charged to the virtual VDD during the light-sleep mode (and also during the active mode). Due to the relatively small size of transistor P6, it cannot charge the first power supply node 140 to the virtual VDD during the light-sleep mode despite being fully on. Thus, the bitcell array power supply voltage during the light-sleep mode is slightly increased with respect to the threshold voltage drop from the memory power supply voltage that would otherwise exist if just transistor P5 were on without the presence of transistor P6. Since the bitcell array power supply voltage is thus only slightly increased from transistor P6 being on, leakage currents are still advantageously reduced during the light-sleep mode yet the transition delay from the light-sleep mode to the active mode may also be reduced. Transistor P6 is an example of a fourth transistor having a first terminal coupled to the second power supply node 145, a second terminal coupled to the first power supply node 140, and a gate coupled to the first node for the light-sleep mode signal. To further reduce the transition time from the light-sleep mode back to the active mode, an inverter 120 may invert the light-sleep mode signal to drive a gate of a PMOS transistor P7 that couples in parallel with transistor P6 between the second power supply node 145 and the first power supply node 140. Transistor P7 is thus off during the light-sleep mode and on during the active mode. The virtual VDD at the second power supply node 145 may then conduct through transistor P7 at the initiation of the active mode from the light-sleep mode to charge the first power supply node 140 more quickly towards the memory power supply voltage. Transistor P7 is an example of a fifth transistor having a first terminal coupled to the second power supply node 145 and a second terminal coupled to the first power supply node 140. Similarly, the inverter 120 is an example of a first inverter having an input terminal coupled to the first node for the light-sleep mode signal and having an output terminal coupled to a gate of the fifth transistor.

Figure 2:
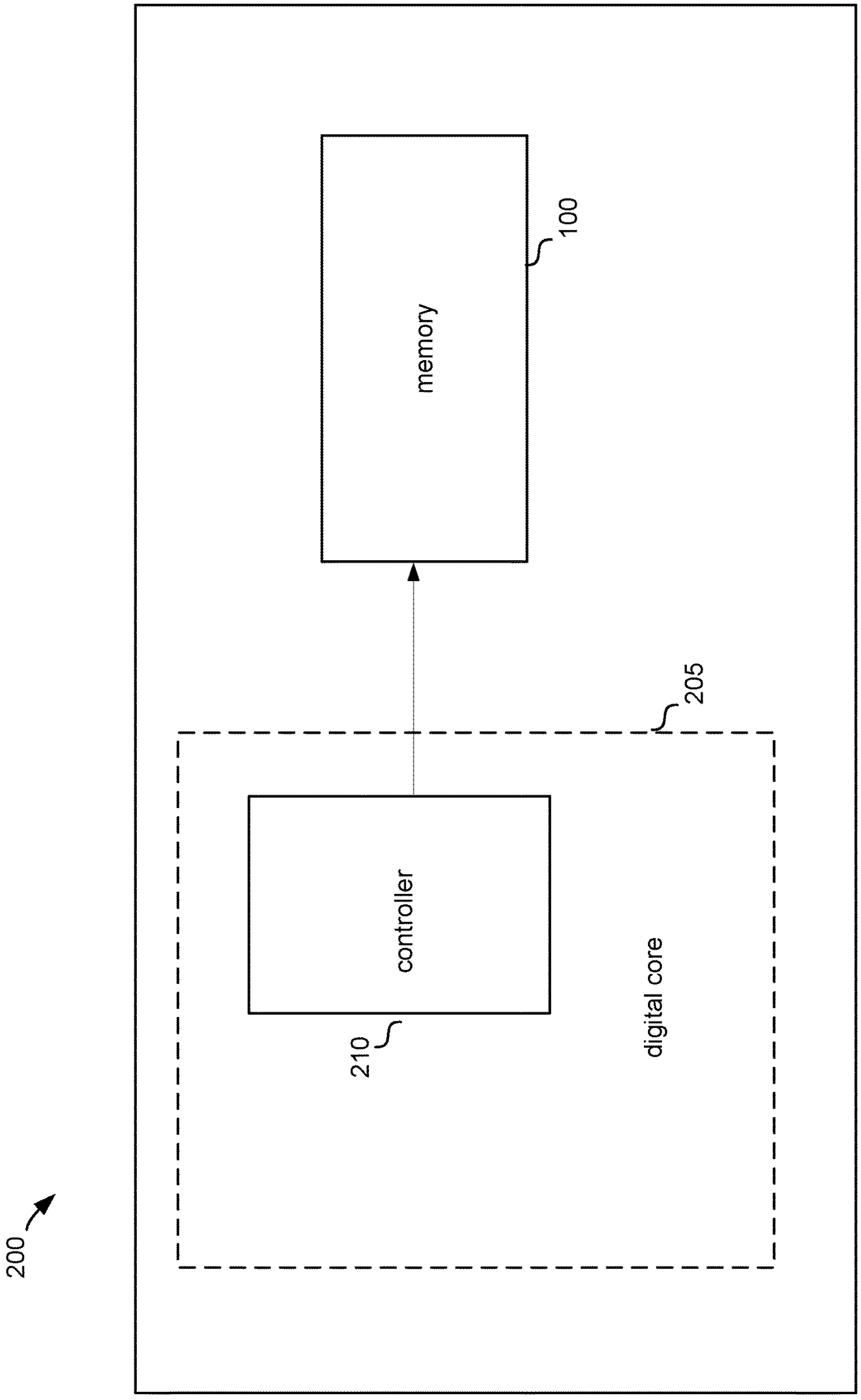
FIG. 2 illustrates an integrated circuit including a memory powered through selectively diode-connected head switch transistors in accordance with an aspect of the disclosure.
Figure 3:
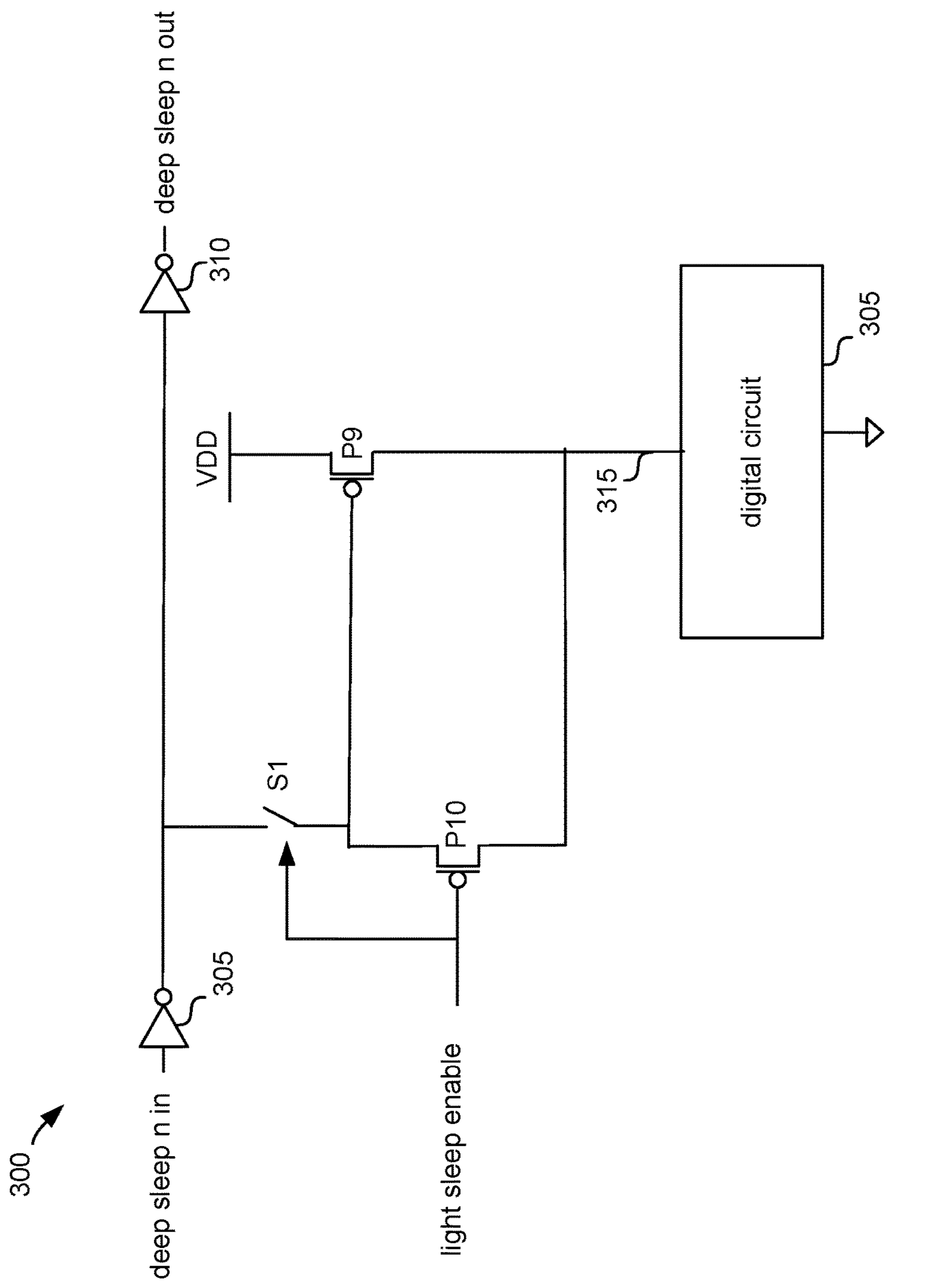
FIG. 3 illustrates an integrated circuit including a digital circuit powered through a selectively diode-connected head switch transistor(s) in accordance with an aspect of the disclosure.

An integrated circuit 200 may include the memory 100 as shown in FIG. 2. Memory 100 is thus an embedded memory within integrated circuit 200. A digital core 205 (e.g. one or more processors) may include a controller 210 for controlling the active, light-sleep, and deep-sleep modes of memory 100. Controller 210 would thus be configured to assert the deep-sleep mode signal to transition memory 100 to the deep-sleep mode and to assert the light-sleep mode signal to transition memory 100 to the light-sleep mode. In this fashion, memory 100 advantageously lowers the power consumption of the integrated circuit 200. With both the light-sleep and the deep-sleep mode signals de-asserted, memory 100 may function in the active mode.

The selective diode connection of a head switch transistor(s) as disclosed herein is not limited to the powering of a memory. For example, a digital circuit 305 in an integrated circuit 300 may be powered by a selectively diode-connected PMOS head switch transistor P9 (it will be appreciated that more than one head switch transistor may replace head switch transistor P9 in alternative implementations). A source of the head switch transistor P9 couples to a power supply voltage rail for a power supply voltage VDD. A drain of head switch transistor P9 couples to a power supply node for the digital circuit 305. During an active mode for the digital circuit 305, transistor P9 is fully on without a diode connection. During a light-sleep mode, a diode-connecting transistor P10 switches on to diode connect a gate of the head switch transistor P9 to the drain of the head switch transistor P9 (or equivalently, to couple the gate of the head switch transistor P9 to the power supply node 315). To initiate the light-sleep mode, a controller (not illustrated) asserts an active-low light-sleep mode signal (light sleep enable) that drives a gate of the diode-connecting transistor P10 to switch the diode-connecting transistor P10 on. During the active mode or during a deep-sleep mode for the digital circuit 305, the light-sleep mode signal is de-asserted by being charged to the power supply voltage VDD.

During the deep-sleep mode, the controller asserts an active-high deep-sleep mode input signal (deep sleep n in). An inverter 305 inverts this charged state of the deep-sleep mode input signal to discharge the gate of head switch transistor P9 through a switch S1 (e.g., a transmission gate). The active low light-sleep mode signal controls switch S1 so that switch S1 is closed while the light-sleep mode signal is de-asserted by being charged to the power supply voltage VDD and so that switch S1 is open while the light-sleep mode signal is asserted by being grounded. The head switch transistor P9 is thus switched off during the deep-sleep mode to power down the digital circuit 315. But during the light-sleep mode, switch S1 opens so that the diode connection of the head switch transistor P9 is not affected by the presence of switch S1.

Note that the integrated circuit 300 may include a plurality of digital circuits (not illustrated) analogous to digital circuit 305 that are also controlled by the deep-sleep mode input signal. These additional digital circuits would each be powered by an equivalent of the selectively diode-connected head switch transistor P9 such that they may each have a light-sleep mode. These additional digital circuits may also include an equivalent of switch S1 that would close during a deep-sleep and active modes but be opened during the light-sleep mode. To allow the deep-sleep input signal to also control a deep-sleep mode in these additional digital circuits, an inverter 310 inverts the output signal from the inverter 305 to produce an active low deep-sleep mode output signal (deep sleep n out) that would function as the deep-sleep mode input signal to a subsequent one (or all) of the additional digital circuits. In this fashion, some or all of the additional digital circuits may be in a deep-sleep mode while the digital circuit 305 is in the light-sleep mode.

Figure 4:
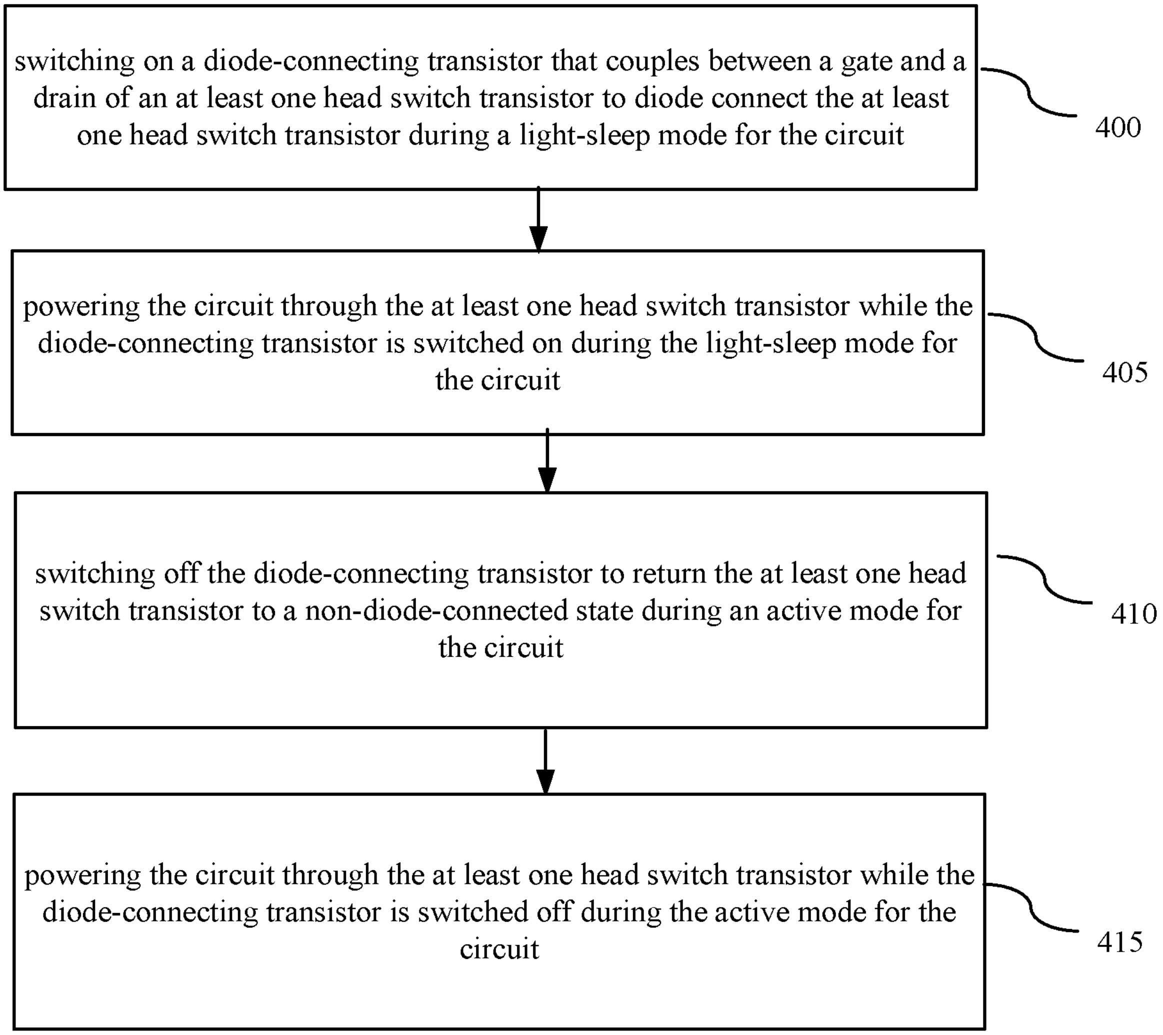
FIG. 4 is a flowchart of a method of selectively diode-connected a head switch transistor for powering a circuit in accordance with an aspect of the disclosure.

A method of powering a circuit through a selectively diode-connected transistor will now be discussed with reference to the flowchart of FIG. 4. The method includes an act 400 of switching on a diode-connecting transistor that couples between a gate and a drain of an at least one head switch transistor to diode connect the at least one head switch transistor during a light-sleep mode for the circuit. The switching on of transistor P5 in memory 100 or of transistor P10 in integrated circuit 300 is an example of act 400. The method also includes an act of powering the circuit through the at least one head switch transistor while the diode-connecting transistor is switched on during the light-sleep mode for the circuit. The powering of the bitcell array 110 through the diode-connected head switch transistors P1 through P4 or the powering of the digital circuit 305 through the diode-connected head switch transistor P9 during the light-sleep mode is an example of act 405. In addition, the method includes an act 410 of switching off the diode-connecting transistor to return the at least one head switch transistor to a non-diode-connected state during an active mode for the circuit. The switching off of transistor P5 in memory 100 or of transistor P10 in integrated circuit 300 during the active mode is an example of act 410. Finally, the method includes an act 415 of powering the circuit through the at least one head switch transistor while the diode-connecting transistor is switched off during the active mode for the circuit. The powering of the bitcell array 110 through the non-diode-connected head switch transistors P1 through P4 or the powering of the digital circuit 305 through the non-diode-connected head switch transistor P9 during the active mode is an example of act 415.

Figure 5:
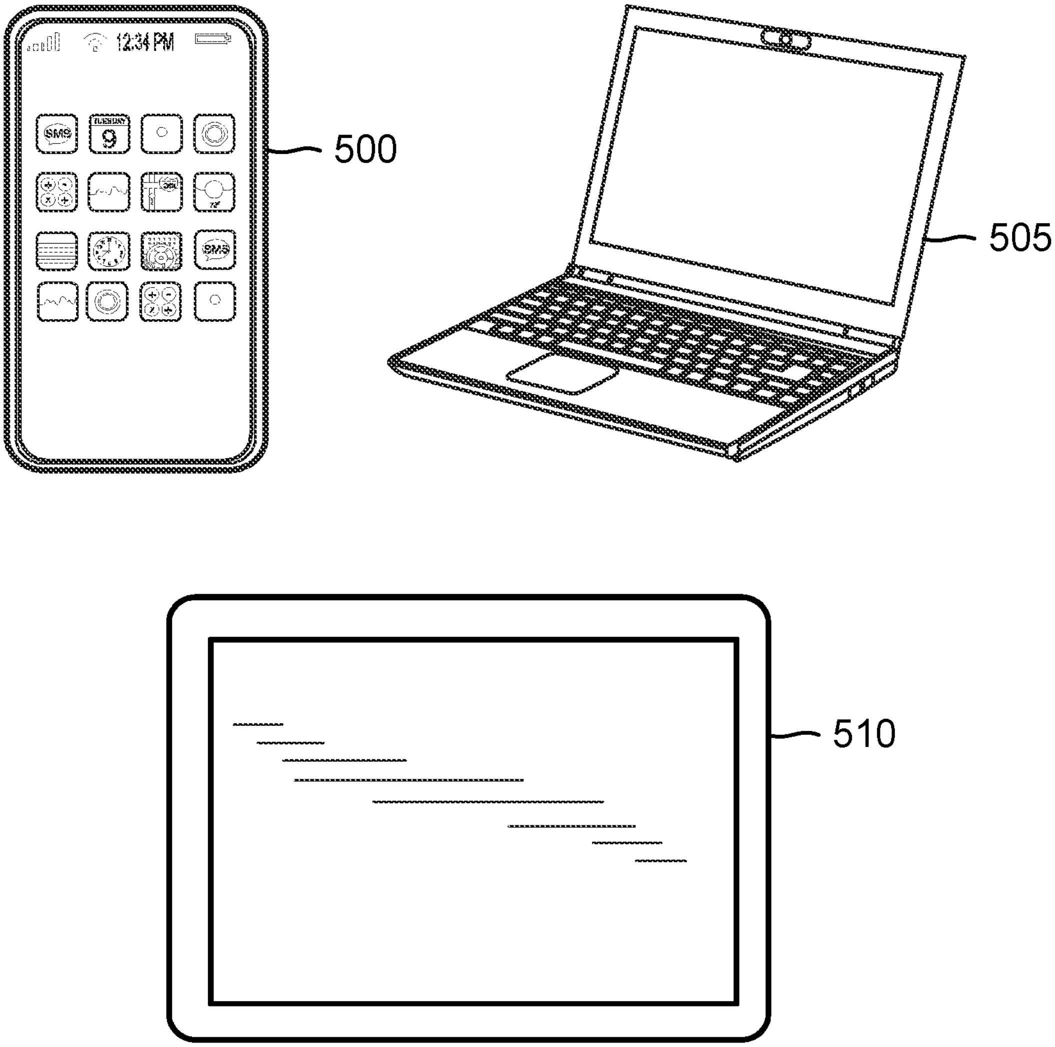
FIG. 5 illustrates some example mobile devices including a circuit powered through a selectively diode-connected head switch transistor(s) in accordance with an aspect of the disclosure.

An integrated circuit having a selectively diode-connected head switch transistor(s) may be advantageously included in a variety of electronic systems. For example, as shown in FIG. 5, a cellular telephone 500, a laptop computer 505, and a tablet PC 510 may all include an integrated circuit having a selectively diode-connected head switch transistor(s) in accordance with the disclosure. Other exemplary electronic systems such as a music player, a video player, a communication device, and a personal computer may also be configured with an integrated circuit including a selectively diode-connected head switch transistor(s) in accordance with the disclosure.

The disclosure will now be summarized in the following series of clauses:

Clause 1. A memory, comprising:
- a bitcell array having a first power supply node for receiving a bitcell array power supply voltage;
- a voltage rail for a memory power supply voltage;
- an at least one first transistor having a first terminal coupled to the voltage rail and a second terminal coupled to the first power supply node; and
- a second transistor having a first terminal coupled to a gate of the at least one first transistor and having a second terminal coupled to the first power supply node.

Clause 2. The memory of clause 1, further comprising:
- a first node for a light-sleep mode signal, wherein the first node is coupled to a gate of the second transistor.

Clause 3. The memory of any of clauses 1-2, wherein the first transistor comprises a plurality of first transistors.

Clause 4. The memory of any of clauses 1-3 wherein the first terminal of each of the first transistor and the second transistor is a source, the second terminal of each of the first transistor and the second transistor is a drain, and wherein the first transistor is a first p-type metal-oxide semiconductor (PMOS) transistor and the second transistor is a second PMOS transistor.

Clause 5. The memory of clause 2, further comprising:
- a memory periphery having a second power supply node for receiving a memory periphery power supply voltage; and
- a third transistor having a first terminal coupled to the voltage rail and having a second terminal coupled to the second power supply node.

Clause 6. The memory of clause 5, wherein the first terminal of the third transistor is a source and the second terminal of the third transistor is a drain, and wherein the third transistor is a PMOS transistor.

Clause 7. The memory of clause 5, further comprising:
- a fourth transistor having a first terminal coupled to the second power supply node, a second terminal coupled to the first power supply node, and a gate coupled to the first node, wherein a size of the fourth transistor is less than a size of the at least one first transistor.

Clause 8. The memory of clause 7, wherein the first terminal of the fourth transistor is a source and the second terminal of the fourth transistor is a drain, and wherein the fourth transistor is a PMOS transistor.

Clause 9. The memory of claim 5, further comprising:
- a fifth transistor having a first terminal coupled to the second power supply node and a second terminal coupled to the first power supply node; and
- a first inverter having an input terminal coupled to the first node and having an output terminal coupled to a gate of the fifth transistor.

Clause 10. The memory of clause 9, wherein the first terminal of the fifth transistor is a source and the second terminal of the fifth transistor is a drain, and wherein the fifth transistor is a PMOS transistor.

Clause 11. The memory of clause 5, further comprising:
- a second node for a deep-sleep mode signal; and
- a second inverter having an input terminal coupled to a second node and having an output terminal coupled to the gate of the at least one first transistor.

Clause 12. The memory of clause 11, further comprising:
- a sixth transistor having a first terminal coupled to a ground terminal of the second inverter, a second terminal coupled to ground, and a gate coupled to the first node.

Clause 13. The memory of clause 12, wherein the first terminal of the sixth transistor is a source and the second terminal of the sixth transistor is a drain, and wherein the sixth transistor is an n-type metal-oxide semiconductor (NMOS) transistor.

Clause 14. The memory of clause 12, further comprising:
- a third inverter having an input terminal coupled to the second node and having an output terminal coupled to a gate of the third transistor.

Clause 15. The memory of any of clauses 1-14, wherein the memory is included within an integrated circuit of a cellular telephone.

Clause 16. A method of powering a circuit comprising:
- switching on a diode-connecting transistor that couples between a gate and a drain of an at least one head switch transistor to diode connect the at least one head switch transistor during a light-sleep mode for the circuit;
- powering the circuit through the at least one head switch transistor while the diode-connecting transistor is switched on during the light-sleep mode for the circuit;
- switching off the diode-connecting transistor to return the at least one head switch transistor to a non-diode-connected state during an active mode for the circuit; and
- powering the circuit through the at least one head switch transistor while the diode-connecting transistor is switched off during the active mode for the circuit.

Clause 17. The method of clause 16, further comprising:
- switching off the at least one head switch transistor during a deep-sleep mode for the circuit.

Clause 18. The method of clause 17, further comprising:
- asserting a deep-sleep mode input signal during the deep-sleep mode for the circuit;
- de-asserting the deep-sleep mode input signal while the deep-sleep mode for the circuit is not active;

inverting the deep-sleep mode input signal to form an inverted signal;

closing a switch to couple the inverted signal to a gate of the at least one head switch transistor during the active mode for the circuit and during the deep-sleep mode for the circuit.

Clause 19. The method of clause 18, further comprising:

opening the switch during the light-sleep mode for the circuit.

Clause 20. The method of any of clauses 18-19, further comprising:

inverting the inverted signal to form a deep-sleep mode output signal.

Clause 21. An integrated circuit, comprising:

a voltage rail for a power supply voltage;

a circuit having a power supply node; and an at least one head switch transistor coupled between the voltage rail and the power supply node, wherein the at least one head switch transistor is configured into a diode-connected state during a light-sleep mode for the circuit and is configured into a non-diode-connected state during an active mode for the circuit.

Clause 22. The integrated circuit of clause 21, further comprising:

a first node for a deep-sleep mode signal; and a switch coupled between the first node for the deep-sleep mode signal and a gate of the at least one head switch transistor.

Clause 23. The integrated circuit of clause 22, wherein the switch is configured to open during the light-sleep mode for the circuit and to close during a deep-sleep mode for the circuit and during an active mode for the circuit.

Clause 24. The integrated circuit of clause 22, further comprising:

a first inverter having an input terminal coupled to a second node for a deep-sleep mode input signal and having an output terminal coupled to the first node for the deep-sleep mode signal.

Clause 25. The integrated circuit of clause 24, further comprising:

a second inverter having an input terminal coupled to the first node for the deep-sleep mode signal and having an output terminal for a deep-sleep mode output signal.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

We claim:

1. A memory, comprising:

a bitcell array having a first power supply node for receiving a bitcell array power supply voltage;

a voltage rail for a memory power supply voltage;

a first transistor having a first terminal coupled to the voltage rail and a second terminal coupled to the first power supply node;

a second transistor having a first terminal coupled to a gate of the first transistor and having a second terminal coupled to the first power supply node;

a first node for a light-sleep mode signal, wherein the first node is coupled to a gate of the second transistor;

a memory periphery having a second power supply node for receiving a memory periphery power supply voltage;

a third transistor having a first terminal coupled to the voltage rail and having a second terminal coupled to the second power supply node; and a fourth transistor having a first terminal coupled to the second power supply node, a second terminal coupled to the first power supply node, and a gate coupled to the first node, wherein a size of the fourth transistor is less than a size of the first transistor.

2. The memory of claim 1, wherein the first transistor comprises a plurality of first transistors.

3. The memory of claim 1 wherein the first terminal of the first transistor and the second transistor is a source, the second terminal of the first transistor and the second transistor is a drain, and wherein the first transistor is a first p-type metal-oxide semiconductor (PMOS) transistor and the second transistor is a second PMOS transistor.

4. The memory of claim 1, wherein the first terminal of the third transistor is a source and the second terminal of the third transistor is a drain, and wherein the third transistor is a PMOS transistor.

5. The memory of claim 1, wherein the first terminal of the fourth transistor is a source and the second terminal of the fourth transistor is a drain, and wherein the fourth transistor is a PMOS transistor.

6. The memory of claim 1, further comprising:

a fifth transistor having a first terminal coupled to the second power supply node and a second terminal coupled to the first power supply node; and a first inverter having an input terminal coupled to the first node and having an output terminal coupled to a gate of the fifth transistor.

7. The memory of claim 6, wherein the first terminal of the fifth transistor is a source and the second terminal of the fifth transistor is a drain, and wherein the fifth transistor is a PMOS transistor.

8. The memory of claim 1, further comprising:

a second node for a deep-sleep mode signal; and a second inverter having an input terminal coupled to the second node and having an output terminal coupled to the gate of the first transistor.

9. The memory of claim 8, further comprising:

a sixth transistor having a first terminal coupled to a ground terminal of the second inverter, a second terminal coupled to ground, and a gate coupled to the first node.

10. The memory of claim 9, wherein the first terminal of the sixth transistor is a source and the second terminal of the sixth transistor is a drain, and wherein the sixth transistor is an n-type metal-oxide semiconductor (NMOS) transistor.

11. The memory of claim 9, further comprising:

a third inverter having an input terminal coupled to the second node and having an output terminal coupled to a gate of the third transistor.

12. The memory of claim 1, wherein the memory is included within an integrated circuit of a cellular telephone.

13. An integrated circuit, comprising:

a voltage rail for a power supply voltage;

a circuit having a power supply node; and a head switch transistor coupled between the voltage rail and the power supply node, wherein the at least one head switch transistor is configured into a diode-connected state during a light-sleep mode for the circuit and is configured into a non-diode-connected state during an active mode for the circuit;

a first node for a deep-sleep mode signal;

a switch coupled between the first node for the deep-sleep mode signal and a gate of the head switch transistor, wherein the switch is configured to open during the light-sleep mode for the circuit and to close during a deep-sleep mode for the circuit and during an active mode for the circuit; and a first inverter having an input terminal coupled to a second node for a deep-sleep mode input signal and having an output terminal coupled to the first node for the deep-sleep mode signal.

14. The integrated circuit of claim 13, further comprising:

a second inverter having an input terminal coupled to the first node for the deep-sleep mode signal and having an output terminal for a deep-sleep mode output signal.

* * * * *